(12) United States Patent
Chen et al.

(10) Patent No.: US 9,240,470 B2
(45) Date of Patent: Jan. 19, 2016

(54) HIGH-PERFORMANCE REVERSE-CONDUCTION FIELD-STOP (RCFS) INSULATED GATE BIPOLAR TRANSISTOR AND METHOD FOR MANUFACTURING THE SAME

(71) Applicant: PFC Device Holdings Limited, New Taipei (TW)

(72) Inventors: Mei-Ling Chen, New Taipei (TW); Hung-Hsin Kuo, New Taipei (TW); Yi-Lun Hsia, New Taipei (TW); Chung-Chen Chang, Saratoga, CA (US)

(73) Assignee: PFC DEVICE HOLDINGS LIMITED, New Taipei (TW)

( * ) Notice: Subject to any disclaimer, the term of this patent is extended or adjusted under 35 U.S.C. 154(b) by 0 days.

(21) Appl. No.: 14/526,090

(22) Filed: Oct. 28, 2014

(65) Prior Publication Data

US 2015/0279980 A1 Oct. 1, 2015

(30) Foreign Application Priority Data

Mar. 31, 2014 (TW) .............................. 103112038 A

(51) Int. Cl.
| | |
|---|---|
| H01L 29/06 | (2006.01) |
| H01L 29/739 | (2006.01) |
| H01L 29/66 | (2006.01) |
| H01L 21/265 | (2006.01) |
| H01L 21/762 | (2006.01) |
| H01L 21/324 | (2006.01) |

(52) U.S. Cl.
CPC ...... *H01L 29/7396* (2013.01); *H01L 21/26506* (2013.01); *H01L 21/324* (2013.01); *H01L 21/76224* (2013.01); *H01L 29/66333* (2013.01)

(58) Field of Classification Search
None
See application file for complete search history.

(56) References Cited

U.S. PATENT DOCUMENTS

| | | | | |
|---|---|---|---|---|
| 2013/0134478 A1* | 5/2013 | Nakajima | ......... | H01L 29/66333 257/139 |
| 2014/0295625 A1* | 10/2014 | Yoshimochi | ........ | H01L 29/7397 438/138 |
| 2014/0312382 A1* | 10/2014 | Lee | .................. | H01L 29/66333 257/139 |
| 2015/0162418 A1* | 6/2015 | Meiser | ............. | H01L 21/02118 438/138 |

* cited by examiner

*Primary Examiner* — Bilkis Jahan
(74) *Attorney, Agent, or Firm* — Muncy, Geissler, Olds & Lowe, P.C.

(57) ABSTRACT

A high-performance reverse-conduction field-stop (RCFS) insulated gate bipolar transistor (IGBT) includes a first conductive type substrate, a plurality of trenches defined on a bottom face of the substrate, a plurality of first conductive type doping regions formed on bottom face of the trenches, a second conductive type doping region formed on bottom face of the substrate, and a first conductive type field stop doping region formed in the substrate and separated from the bottom face of the substrate by a field stop depth, where the field stop depth is larger than a depth of the trench. Due to a separation between the first conductive type doping regions and the second conductive type doping region, Zener diode can be prevented from forming on bottom side of the substrate and the performance of IGBT can be accordingly enhanced.

12 Claims, 8 Drawing Sheets

HIGH-PERFORMANCE REVERSE-CONDUCTION FIELD-STOP (RCFS) INSULATED GATE BIPOLAR TRANSISTOR AND METHOD FOR MANUFACTURING THE SAME

BACKGROUND OF THE INVENTION

1. Field of the Invention

The present invention relates to an insulated gate bipolar transistor and method for manufacturing the same, especially to a high-performance insulated gate bipolar transistor and method for manufacturing the same.

2. Description of Prior Art

Insulated gate bipolar transistor (IGBT) is a semiconductor device combining the features of metal-oxide-semiconductor field effect transistor (MOSFET) and bipolar junction transistor (BJT). IGBT has the advantages of gate-controlling ability of MOSFET and low turn-on voltage of BJT and is thus extensively used in high voltage and high power applications.

A conventional IGBT, such as a punch through (PT) IGBT, mainly comprises a P+ type semiconductor substrate and N-type buffer layer arranged thereon. An N type epitaxial layer is formed on the N-type buffer layer and functions as drain of parasitic MOSFET in the IGBT. Moreover, a gate and an emitter are formed in the N type epitaxial layer, and a collector is formed on bottom face of the P+ type substrate. The breakdown voltage of the PT IGBT is determined by the P+ type substrate and N-type buffer layer because a maximum electric field is generated therebetween.

Another conventional IGBT, such as a non-punch through (NPT) IGBT, does not use N-type buffer layer. The breakdown voltage of the NPT IGBT is determined by the avalanche mechanism of the N type epitaxial (N drift) layer. To increase the breakdown voltage, field stop (FS) IGBT was developed, where the N-type buffer layer in PT IGBT is replaced by a field stop ion implantation layer. Therefore, the abrupt junction in the PT IGBT is also replaced by a graded (such as a linearly graded) N type profile. The value of the maximum electric field can be advantageously reduced to enhance breakdown voltage.

However, in above-mentioned three types of IGBTs, a fast return epitaxial diode (FRED) is needed to parallel connect with the IGBT to release turn-off current. Therefore, a reverse-conducted diode is built-in above mentioned IGBTs for soft switching. This kind of IGBT is referred to as reverse conduction field stop (RCFS) IGBT. The conventional RCFS IGBT is first formed with N+ type doped layer on backside of substrate by using metal mask, then formed with P+ type doped layer functioning as collector, and finally formed with N+ type doped layer and P type doped layer by rapid thermal annealing. Nevertheless, lateral Zener diode tends to form in the RCFS because the N+ doped layer and the P type doped layer are on the same horizontal plane of the backside of the substrate.

SUMMARY OF THE INVENTION

Accordingly, one object of the present invention is to provide a high-performance insulated gate bipolar transistor (IGBT) with suppression of parasitic Zener diode, and method for manufacturing the IGBT.

According to one aspect of the present invention provides a method for manufacturing a high-performance insulated gate bipolar transistor (IGBT), comprising the following steps: (a) providing a first conductive type substrate and manufacturing a semi-finished semiconductor device on a front side of the substrate; (b) covering a front side of the semiconductor device with a protection layer; (c) performing an ion implantation process on back side of the first conductive type substrate to form a first conductive type field stop ion implantation with a field stop depth from a back face of the first conductive type substrate; (d) forming a plurality of trenches on the back side of the first conductive type substrate, each of the trenches having a trench depth smaller than the field stop depth; (e) performing an ion implantation process on back side of the first conductive type substrate to form a first conductive type ion implantation pattern on bottom faces of the trenches; and (f) performing an ion implantation process on back side of the first conductive type substrate to form a second conductive type ion implantation layer on back face of the first conductive type substrate.

According to another aspect of the present invention provides a method for manufacturing a high-performance insulated gate bipolar transistor (IGBT), comprising the following steps: (a) providing a first conductive type substrate and manufacturing a semi-finished semiconductor device on a front side of the substrate; (b) covering a front side of the semiconductor device with a protection layer; (c) forming a plurality of trenches on the back side of the first conductive type substrate, each of the trenches having a trench depth; (d) performing an ion implantation process on back side of the first conductive type substrate to form a first conductive type ion implantation pattern on bottom faces of the trenches; (e) performing an ion implantation process on back side of the first conductive type substrate to form a second conductive type ion implantation layer on back face of the first conductive type substrate; and (f) performing an ion implantation process on back side of the first conductive type substrate to form a first conductive type field stop ion implantation with a field stop depth from back face of the first conductive type substrate, where the trench depth is smaller than the field stop depth.

According to still another aspect of the present invention provides a high-performance insulated gate bipolar transistor (IGBT), comprising: a first conductive type substrate; a plurality of trenches defined on a bottom face of the first conductive type substrate; a plurality of first conductive type doping regions formed on bottom faces of the trenches; a second conductive type doping region formed on the bottom face of the first conductive type substrate; and a first conductive type field stop doping region formed in the first conductive type substrate and separated with the bottom face of the first conductive type substrate with a field stop depth, where the field stop depth is larger than a depth of the trench.

According the present invention, the high-performance insulated gate bipolar transistor (IGBT) thus manufactured has a plurality trenches and a first conductive type (either N type or P type) doping regions on bottom faces of the trenches. The subsequent conductive type doping will be either P type or N type respectively. Therefore, the PN junction on backside of the substrate is irregular and Zener diode can be prevented from forming to enhance the performance of the IGBT.

BRIEF DESCRIPTION OF DRAWING

The features of the invention believed to be novel are set forth with particularity in the appended claims. The invention itself however may be best understood by referring to the following detailed description of the invention, which describes certain exemplary embodiments of the invention, taken in conjunction with the accompanying drawings in which:

DETAILED DESCRIPTION OF THE INVENTION

FIGS. 1A to 1L show the manufacturing process for the high-performance insulated gate bipolar transistor (IGBT) according to a first embodiment of the present invention.

Figure 1A:
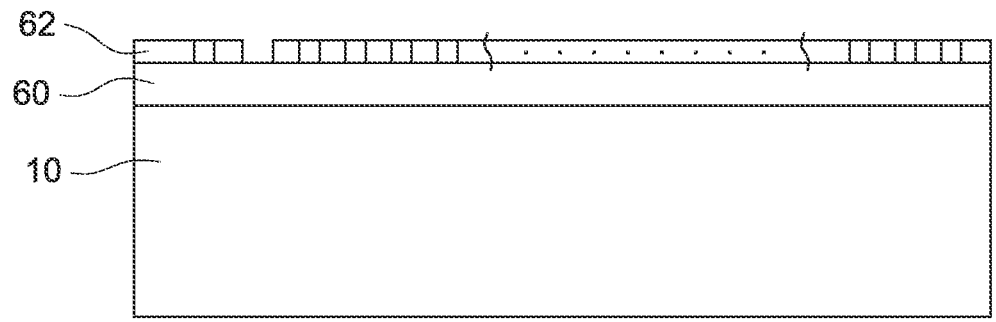
FIGS. 1A to 1L show the manufacturing process for the high-performance insulated gate bipolar transistor (IGBT) according to a first embodiment of the present invention.
Figure 1B:
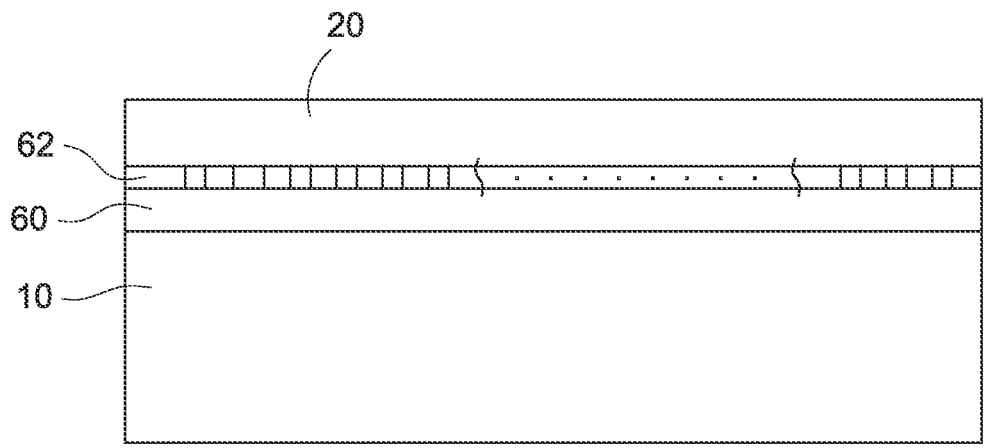

As shown in FIG. 1A, part of standard processes for manufacturing a MOSFET device are first performed on an N type substrate 10 (namely, the front end devices 60 and contact holes 62 shown in this figure are finished, and therefore the MOSFET device is semi-finished), and then, as shown in FIG. 1B, a protection layer 20 (such as binding tape, protection carrier or protection film) is used to cover the front portion of the MOSFET device. More particularly, the MOSFET device shown in FIG. 1A has been finished with the contact hole thereof being etched to 90% and interlayer dielectric being increased with 10% thickness such that the interlayer dielectric can protect the front portion of the IGBT device in later processes.

Figure 1C:
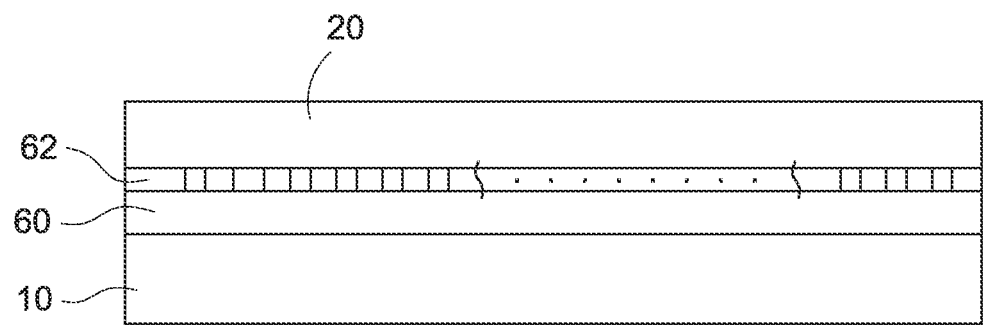

As shown in FIG. 1C, the N type substrate 10 is polished at back side thereof, then stress release wet etching and cleaning are performed for the N type substrate 10 to thin the N type substrate 10 (namely, decrease the thickness of the N type substrate 10). The remaining thickness of the N type substrate 10 is relevant to the demanded voltage tolerance for the high-performance IGBT to be manufactured.

Figure 1D:
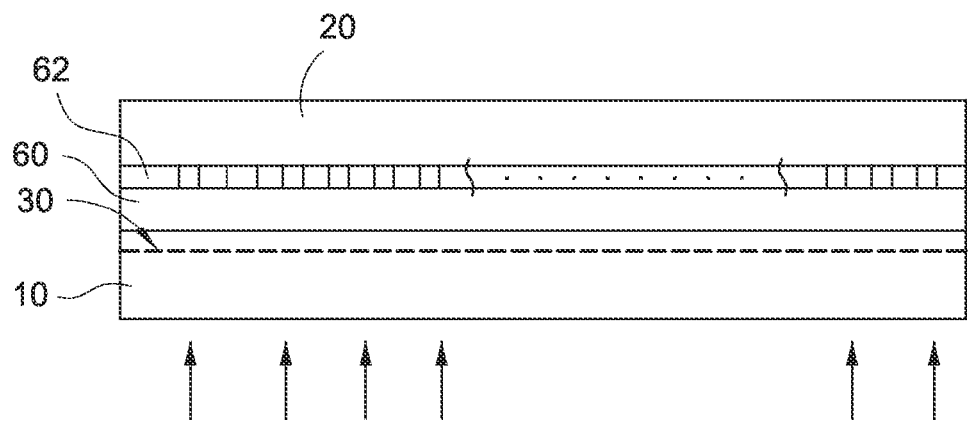
Figure 1E:
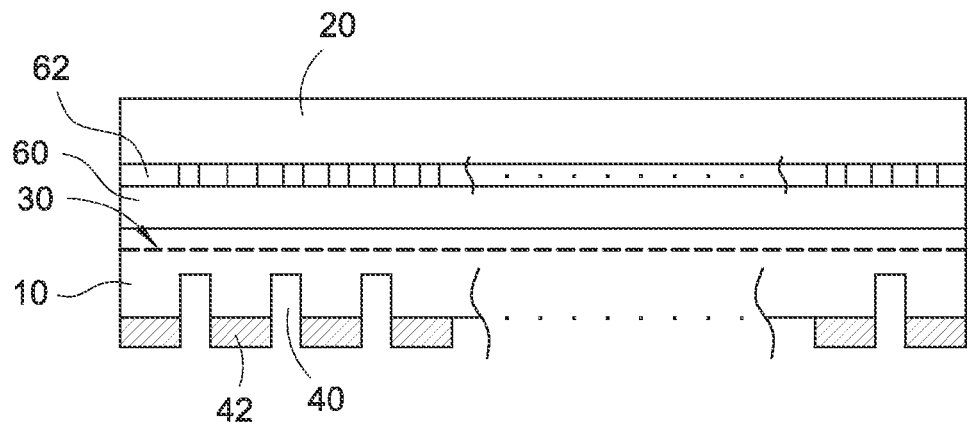

As shown in FIG. 1D, after the backside polishing, an ion implantation process is performed to form an N type field stop ion implantation layer 30 on the back side of the N type substrate 10, where the N type field stop ion implantation layer 30 is separated with the bottom face of the N type substrate 10 by a field stop depth. As shown in FIG. 1E, a photoresist pattern 42 is formed on the bottom face of the N type substrate 10 and the photoresist pattern 42 is used as mask to etch a plurality of trenches 40 on the back side of the N type substrate 10. Namely, the backside portion of the N type substrate 10, which is not covered by the photoresist pattern 42, is etched to form the plurality of trenches 40. Moreover, each of the trenches 40 has a trench depth and the trench depth is larger than 1 micrometer.

Figure 1F:
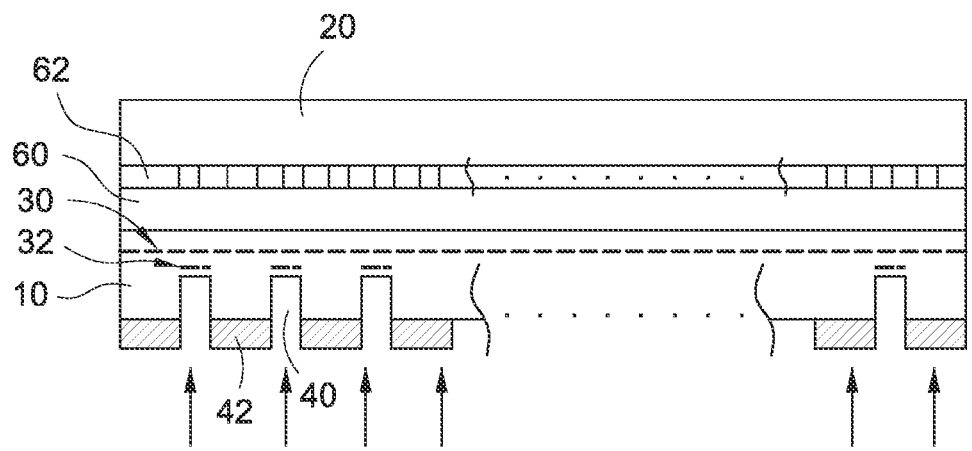

As shown in FIG. 1F, the photoresist pattern 42 is used as mask for ion implantation and another ion implantation process is performed on the back side of the N type substrate 10 to form an N type ion implantation pattern 32. Because the trenches 40 are present at this ion implantation process, the N type ion implantation pattern 32 is formed on the bottom faces of the trenches, which are not covered by the photoresist pattern 42. Therefore, the N type ion implantation pattern 32 is separated with the bottom face of the N type substrate 10 by the trench depth, where the field stop depth is larger than the trench depth. In other word, the N type field stop ion implantation layer 30 is deeper than the N type ion implantation pattern 32 to provide field stop function.

Figure 1G:
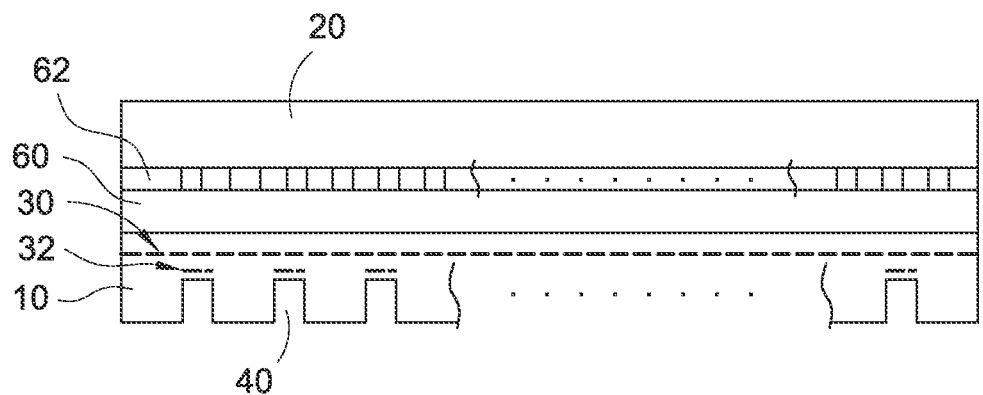
Figure 1H:
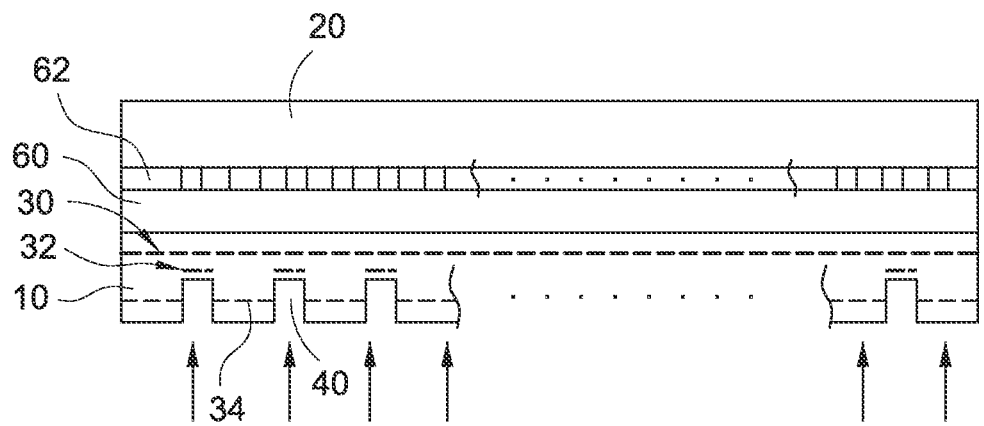

As shown in FIGS. 1G and 1H, after removing the photoresist pattern 42, another ion implantation process is performed on the back side of the N type substrate 10 to form an P type ion implantation layer 34 on the remaining bottom face of the N type substrate 10.

Figure 1I:
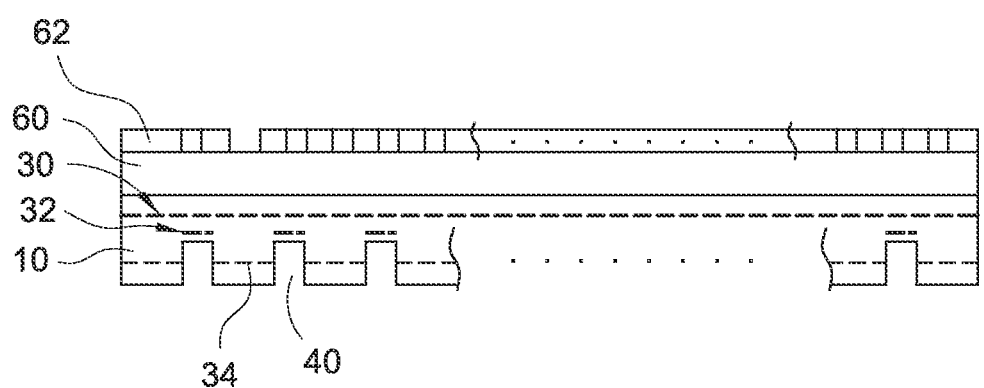
Figure 1J:
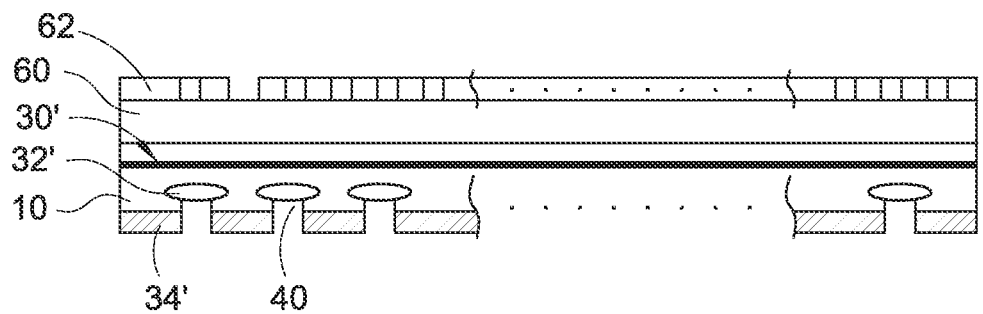

As shown in FIGS. 1I and 1J, after removing the protection layer 20, cleaning process with DHF and thermal annealing process are performed to form N type field stop doping region 30', N type doping region 32' and P type doping region 34', respectively.

Figure 1K:
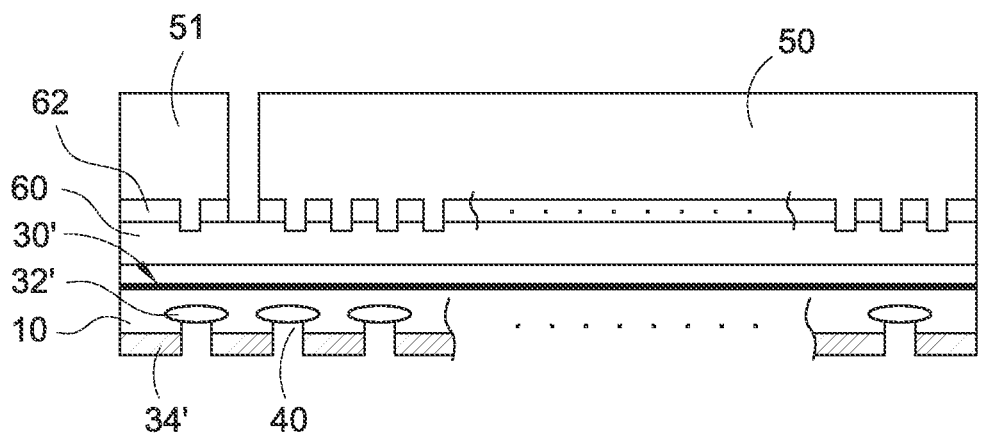
Figure 1L:
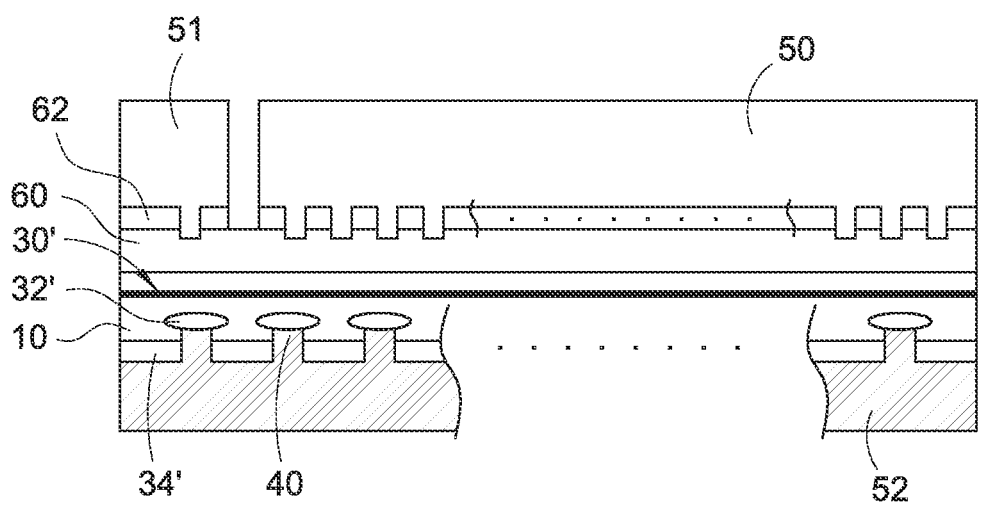

As shown in FIGS. 1K and 1L, after the thermal annealing process, emitter metal layer 50 and gate metal layer 51 are formed on top side of the N type substrate 10. Moreover, collector metal layer 52 is formed on bottom side of the N type substrate 10. The emitter metal layer 50, the gate metal layer 51 and the collector metal layer 52 can be formed by sputtering process, and the material of the emitter metal layer 50, the gate metal layer 51 and the collector metal layer 52 can be, but not limited to, aluminum (Al), TiN or tungsten (W).

As shown in FIG. 1L, the bottom side of the N type substrate 10 is formed with the plurality of the trenches 40 with trench depth larger than 1 micrometer. Moreover, the N type doping region 32' is formed on the bottom faces of the trenches 40 such that the N type doping region 32' has sufficient separation with the P type doping region 34' along depth direction. Therefore, the PN junction at the back side of the N type substrate 10 is irregular to prevent the Zener diode from forming and to enhance the performance of the IGBT device.

FIGS. 2A to 2L show the manufacturing process for the high-performance insulated gate bipolar transistor (IGBT) according to a second embodiment of the present invention.

Figure 2A:
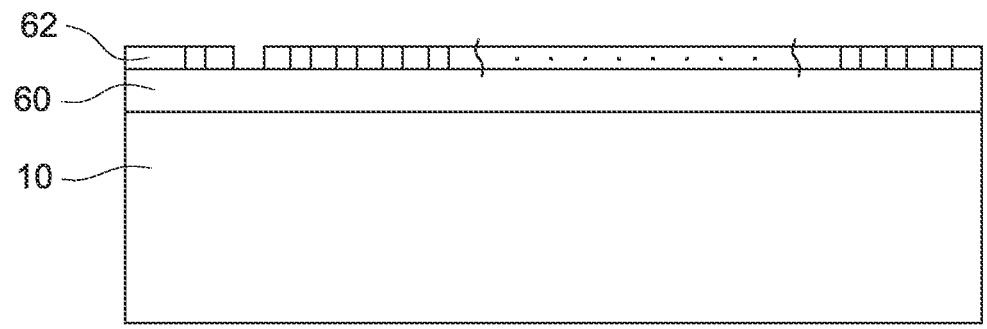
FIGS. 2A to 2L show the manufacturing process for the high-performance insulated gate bipolar transistor (IGBT) according to a second embodiment of the present invention.
Figure 2B:
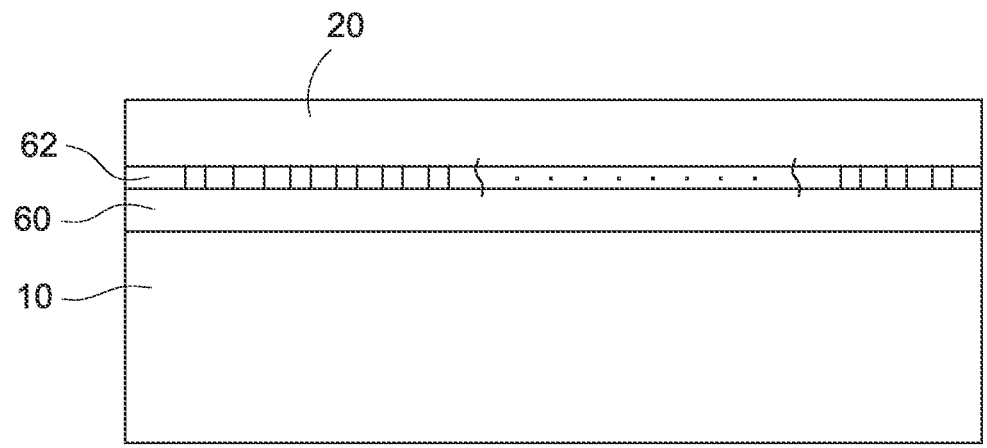

As shown in FIG. 2A, part of standard processes for manufacturing a MOSFET are first performed on an N type substrate 10 (namely, the front end devices 60 and contact holes 62 shown in this figure are finished), and then, as shown in FIG. 2B, a protection layer 20 (such as binding tape, protection carrier or protection film) is used to cover the front portion of the MOSFET device. More particularly, the MOSFET device shown in FIG. 2A has been finished with contact hole being etched to 90% and interlayer dielectric being increased with 10% thickness such that the interlayer dielectric can protect the front portion of the IGBT device in later processes.

Figure 2C:
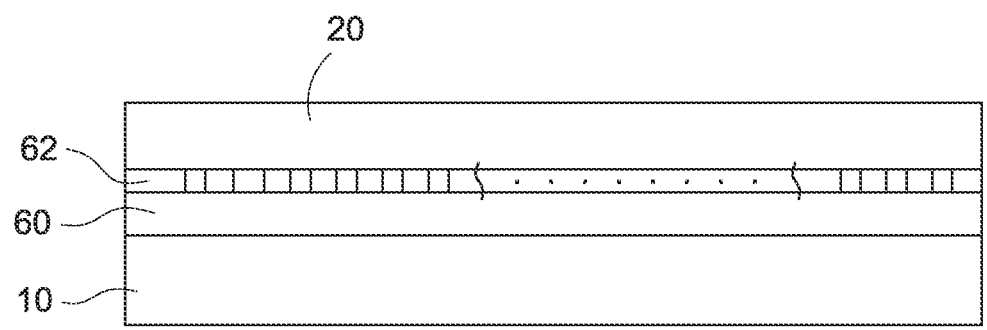

As shown in FIG. 2C, the N type substrate 10 is polished at back side thereof, then stress release wet etching and cleaning are performed for the N type substrate 10 to thin the N type substrate 10. The remaining thickness of the N type substrate 10 is relevant to the demanded voltage tolerance for the high-performance IGBT to be manufactured.

Figure 2D:
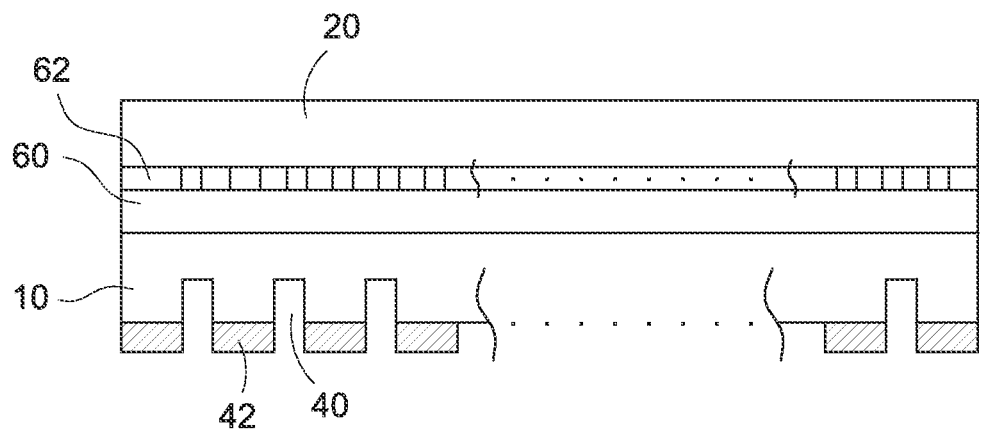
Figure 2E:
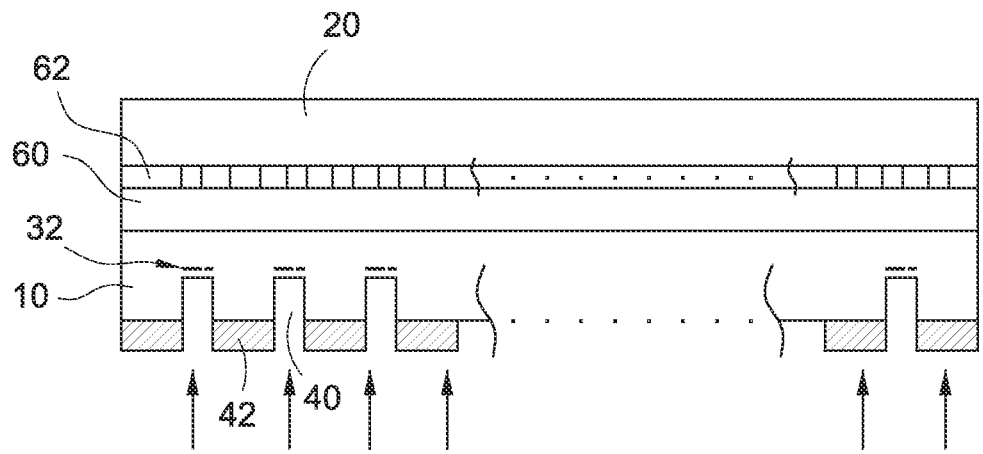

As shown in FIG. 2D, after the backside polishing, a photoresist pattern 42 is formed on the bottom face of the N type substrate 10 and the photoresist pattern 42 is used as mask to etch a plurality of trenches 40 on the back side of the N type substrate 10. Namely, the backside portion of the N type substrate 10, which is not covered by the photoresist pattern 42, is etched to form the plurality of trenches 40. Moreover, each of the trenches 40 has a trench depth and the trench depth is larger than 1 micrometer. As shown in FIG. 2E, after forming the trenches 40, the photoresist pattern 42 is used as mask for ion implantation and an ion implantation process is performed on the back side of the N type substrate 10 to form an N type ion implantation pattern 32. The N type ion implantation pattern 32 is formed on the bottom faces of the trenches, which are not covered by the photoresist pattern 42. Therefore, the N type ion implantation pattern 32 is separated with the bottom face of the N type substrate 10 by the trench depth larger than 1 micrometer.

Figure 2F:
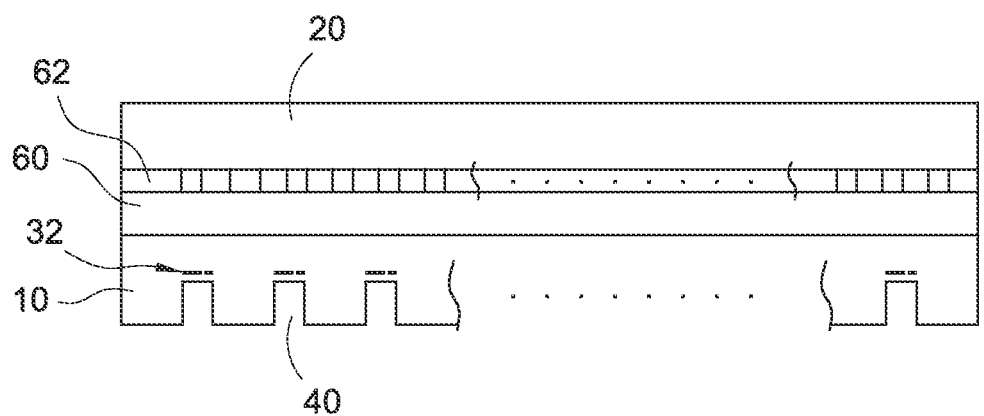
Figure 2G:
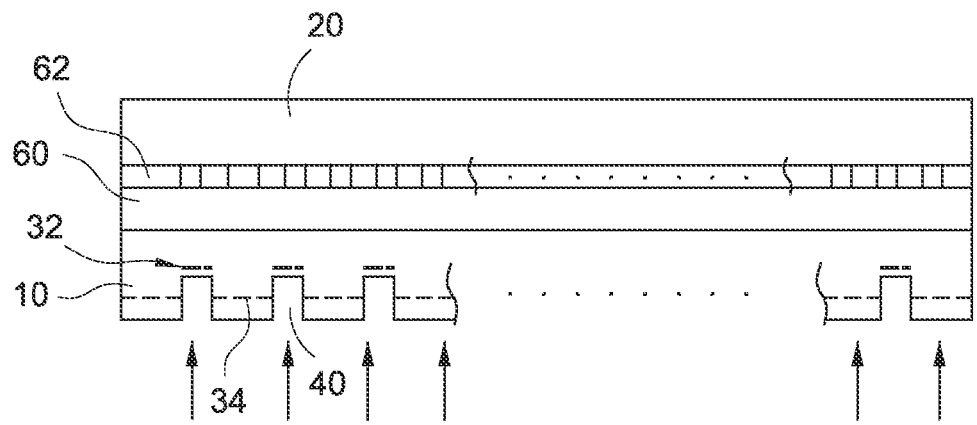
Figure 2H:
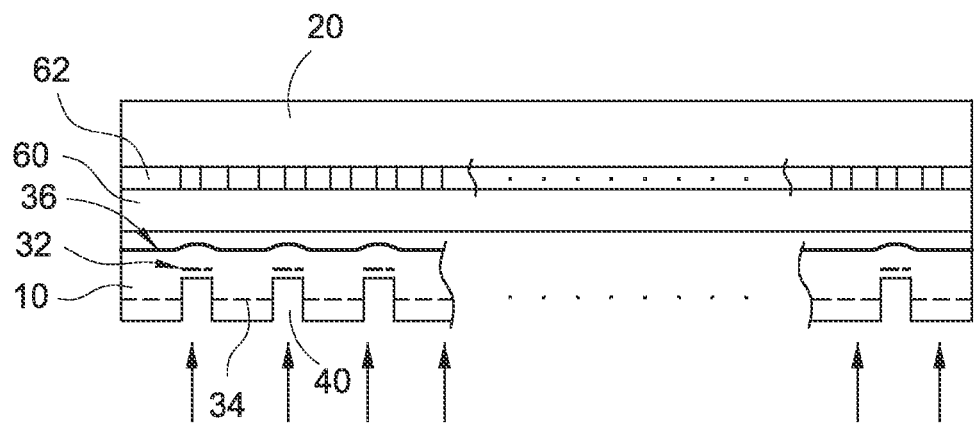

As shown in FIGS. 2F and 2G, after removing the photoresist pattern 42, another ion implantation process is performed on the back side of the N type substrate 10 to form a P type ion implantation layer 34 on the remaining bottom face of the N type substrate 10. As shown in FIG. 2H, still another ion implantation process is performed on the back side of the N type substrate 10 to form an N type field stop ion implantation layer 36 on the back side of the N type substrate 10. Moreover, the N type field stop ion implantation layer 36 is separated with the bottom face of the N type substrate 10 by a field stop depth, where the field stop depth is larger than the trench depth. In other word, the N type field stop ion implantation layer 36 is deeper than the N type ion implantation pattern 32 to provide field stop function.

In the second embodiment, the N type field stop ion implantation layer 36 is formed after the trenches 40 are defined. Therefore, the N type field stop ion implantation layer 36 in the second embodiment has more fluctuated profile in comparison with the N type field stop ion implantation layer 30 in the first embodiment.

Figure 2I:
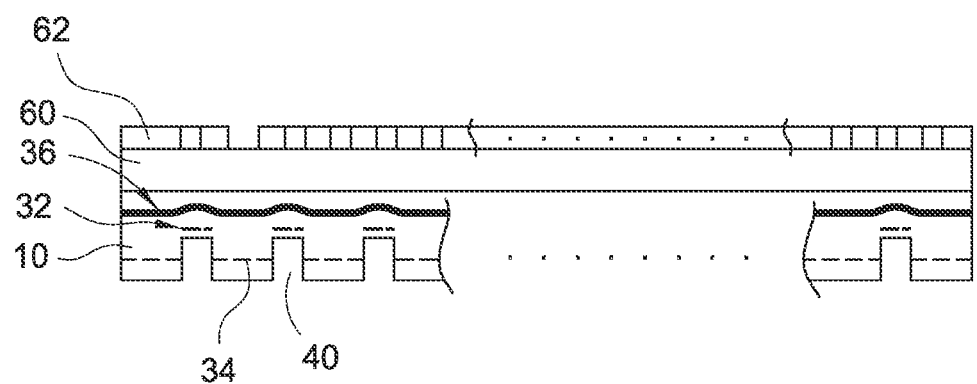
Figure 2J:
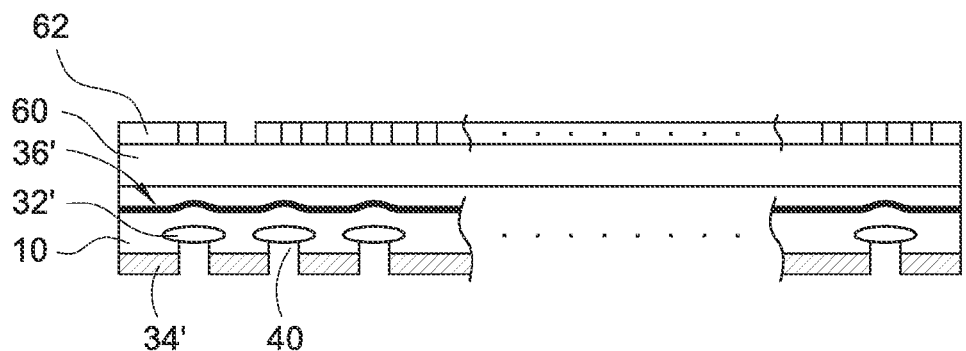

As shown in FIGS. 2I and 2J, after removing the protection layer 20, cleaning process with DHF and thermal annealing process are performed to form N type field stop doping region 36', N type doping region 32' and P type doping region 34', respectively.

Figure 2K:
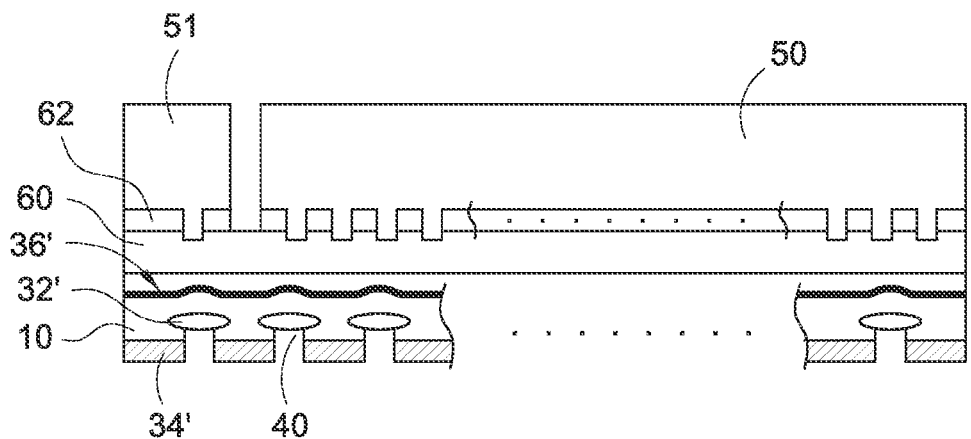
Figure 2L:
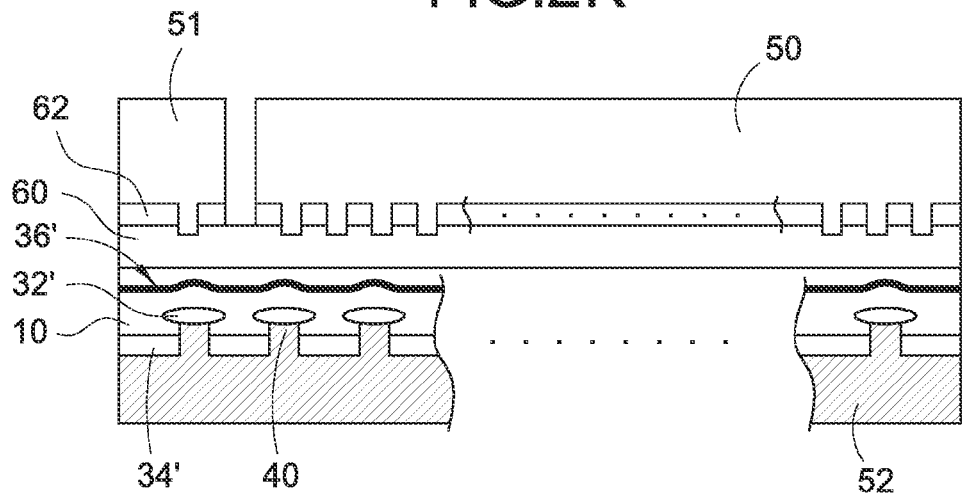

As shown in FIGS. 2K and 2L, after the thermal annealing process, emitter metal layer 50 and gate metal layer 51 are formed on top side of the N type substrate 10. Moreover, collector metal layer 52 is formed on bottom side of the N type substrate 10. The emitter metal layer 50, the gate metal layer 51 and the collector metal layer 52 can be formed by sputtering process, and the material of the emitter metal layer 50, the gate metal layer 51 and the collector metal layer 52 can be, but not limited to, aluminum (Al), TiN or tungsten (W).

As shown in FIG. 2L, the bottom side of the N type substrate 10 is formed with the plurality of the trenches 40 with trench depth larger than 1 micrometer. Moreover, the N type doping region 32' is formed on the bottom of the trenches 40 such that the N type doping region 32' has sufficient separation with the P type doping region 34' along the depth direction. Therefore, the PN junction at the back side of the N type substrate 10 is irregular to prevent the Zener diode from forming and to enhance the performance of the IGBT device. Moreover, the N type field stop doping region 36' also has fluctuated profile to further prevent the forming of the Zener diode.

The present invention is descried with above mentioned embodiment. However, the skilled in the related art can easily know the present invention has additional variations and embodiments. For example, the N type substrate 10 can be replaced with P type substrate, and the original N type doping is replaced by P type doping. Similarly the original P type doping is replaced by N type doping. This kind of variation can still have the effect to prevent the forming of the Zener diode.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A high-performance reverse-conduction field-stop (RCFS) insulated gate bipolar transistor (IGBT), comprising:
   a first conductive type substrate;
   a plurality of trenches defined on a bottom face of the first conductive type substrate;
   a plurality of first conductive type doping regions formed on bottom faces of the trenches;
   a second conductive type doping region formed on the bottom face of the first conductive type substrate; and
   a first conductive type field stop doping region formed in the first conductive type substrate and separated with the bottom face of the first conductive type substrate with a field stop depth, where the field stop depth is larger than a depth of the trench, wherein the first conductive type is either N type or P type, and the second conductive type is either P type or N type correspondingly.

2. The high-performance RCFS IGBT in claim 1, wherein the first conductive type field stop doping region has fluctuated profile.

3. The high-performance RCFS IGBT in claim 1, wherein the trench depth is larger than 1 micrometer.

4. The high-performance RCFS IGBT in claim 1, further comprising: emitter metal layer and gate metal layer on front side of the first conductive type substrate, and collector metal layer on back side of the first conductive type substrate.

5. A method for manufacturing the high-performance reverse-conduction field-stop (RCFS) insulated gate bipolar transistor (IGBT) of claim 1, comprising:
   (a) providing a first conductive type substrate and manufacturing a semi-finished semiconductor device on a front side of the substrate;
   (b) covering a front side of the semiconductor device with a protection layer;
   (c) performing an ion implantation process on back side of the first conductive type substrate to form a first conductive type field stop ion implantation with a field stop depth from a back face of the first conductive type substrate;
   (d) forming a plurality of trenches on the back side of the first conductive type substrate, each of the trenches having a trench depth smaller than the field stop depth;
   (e) performing an ion implantation process on back side of the first conductive type substrate to form a first conductive type ion implantation pattern on bottom faces of the trenches; and
   (f) performing an ion implantation process on back side of the first conductive type substrate to form a second conductive type ion implantation layer on back face of the first conductive type substrate,
   wherein the first conductive type is either N type or P type, and the second conductive type is either P type or N type correspondingly.

6. The method for manufacturing a high-performance RCFS IGBT in claim 5, further comprising: after step (b), removing part of back side of the first conductive type substrate.

7. The method for manufacturing a high-performance RCFS IGBT in claim 5, further comprising: after step (f), performing thermal annealing process to form first conductive type field stop doping region, first conductive type doping region, and second conductive type doping region, respectively.

8. The method for manufacturing a high-performance RCFS IGBT in claim 5, wherein the trench depth is larger than 1 micrometer.

9. A method for manufacturing the high-performance reverse-conduction field-stop (RCFS) insulated gate bipolar transistor (IGBT) of claim 1, comprising:
   (a) providing a first conductive type substrate and manufacturing a semi-finished semiconductor device on a front side of the substrate;
   (b) covering a front side of the semiconductor device with a protection layer;

(c) forming a plurality of trenches on the back side of the first conductive type substrate, each of the trenches having a trench depth;

(d) performing an ion implantation process on back side of the first conductive type substrate to form a first conductive type ion implantation pattern on bottom faces of the trenches;

(e) performing an ion implantation process on back side of the first conductive type substrate to form a second conductive type ion implantation layer on back face of the first conductive type substrate; and (f) performing an ion implantation process on back side of the first conductive type substrate to form a first conductive type field stop ion implantation with a field stop depth from back face of the first conductive type substrate, where the trench depth is smaller than the field stop depth, wherein the first conductive type is either N type or P type, and the second conductive type is either P type or N type correspondingly.

10. The method for manufacturing a high-performance RCFS IGBT in claim 9, further comprising: after step (b), removing part of back side of the first conductive type substrate.

11. The method for manufacturing a high-performance I RCFS GBT in claim 9, further comprising: after step (f), performing thermal annealing process to form first conductive type field stop doping region, first conductive type doping region, and second conductive type doping region, respectively.

12. The method for manufacturing a high-performance RCFS IGBT in claim 9, wherein the trench depth is larger than 1 micrometer.

* * * * *